(12) United States Patent
Kondo et al.

(10) Patent No.: US 9,558,919 B2
(45) Date of Patent: Jan. 31, 2017

(54) METHOD OF MODIFYING ELECTROSTATIC CHUCK AND PLASMA PROCESSING APPARATUS

(71) Applicant: Tokyo Electron Limited, Tokyo (JP)

(72) Inventors: Takamitsu Kondo, Miyagi (JP); Shingo Shimogama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 484 days.

(21) Appl. No.: 14/100,235

(22) Filed: Dec. 9, 2013

(65) Prior Publication Data
US 2014/0158154 A1    Jun. 12, 2014

Related U.S. Application Data

(60) Provisional application No. 61/739,309, filed on Dec. 19, 2012.

(30) Foreign Application Priority Data

Dec. 12, 2012  (JP) .................................. 2012-271789

(51) Int. Cl.
C03C 25/68    (2006.01)
H01J 37/32    (2006.01)

(52) U.S. Cl.
CPC ...... *H01J 37/32697* (2013.01); *H01J 37/3266* (2013.01); *H01J 37/32091* (2013.01); *H01J 37/32532* (2013.01); *H01J 37/32715* (2013.01)

(58) Field of Classification Search
CPC .................. H01J 37/32091; H01J 37/32715; H01J 37/32697; H01J 37/3266; H01J 37/32532

USPC .......... 216/67, 70, 71; 156/345.51; 438/707, 438/728, 732

See application file for complete search history.

(56) References Cited

U.S. PATENT DOCUMENTS

| 7,968,205 B2* | 6/2011 | Nakano ..................... C23C 4/02 428/469 |
| 2008/0106842 A1* | 5/2008 | Ito ..................... H01L 21/67028 361/234 |
| 2008/0273284 A1* | 11/2008 | Itakura ................ H01L 21/6831 361/234 |
| 2009/0120790 A1* | 5/2009 | O'Donnell ................ C23C 4/02 204/298.31 |
| 2010/0098875 A1* | 4/2010 | Fischer ................... C23C 16/04 427/534 |
| 2010/0140221 A1* | 6/2010 | Kikuchi ............ H01J 37/32091 216/67 |

(Continued)

FOREIGN PATENT DOCUMENTS

JP  H09-249976    9/1997
JP  2003-243360   8/2003

(Continued)

*Primary Examiner* — Binh X Tran
(74) *Attorney, Agent, or Firm* — IPUSA, PLLC

(57) ABSTRACT

A method of modifying an electrostatic chuck that electrostatically attracts a processing object is provided. The method includes a gas supplying step of supplying a gas containing hydrogen (H) and oxygen (O) into a chamber accommodating the electrostatic chuck having a surface that is fluorinated; and a modifying step of turning the gas supplied to the chamber into plasma using a high frequency power, exposing the electrostatic chuck to the plasma, and modifying the fluorinated surface of the electrostatic chuck.

8 Claims, 11 Drawing Sheets

(56) References Cited

U.S. PATENT DOCUMENTS

| | | | |
|---|---|---|---|
| 2011/0048453 A1* | 3/2011 | Honda | H01J 37/32862 134/1.1 |
| 2011/0056514 A1* | 3/2011 | Lee | H01J 37/321 134/1.1 |
| 2012/0141661 A1* | 6/2012 | Cho | H01L 21/6833 427/58 |
| 2013/0087174 A1* | 4/2013 | Sun | B08B 5/00 134/30 |
| 2013/0162142 A1* | 6/2013 | Nishino | H05H 1/46 315/111.21 |

FOREIGN PATENT DOCUMENTS

| | | |
|---|---|---|
| JP | 2008-117982 | 5/2008 |
| JP | 2008-519431 | 6/2008 |
| WO | WO 2006/049954 | 5/2006 |

\* cited by examiner

FIG.13

| | PRES-SURE (mT) | HBr (sccm) | O₂ (sccm) | Ar (sccm) | TIME (sec) | PIN TORQUE UPON WAFER SEPARATION (%) | | |
|---|---|---|---|---|---|---|---|---|
| | | | | | | WLDC BEFORE MODIFYING STEP | WLDC→ MODIFYING STEP | WLDC AFTER MODIFYING STEP |
| HBr/O₂ RATIO (1) | 300 | 450 | 450 | 0 | 10 | 16.8 | 15.9 | 11.7 |
| HBr/O₂ RATIO (2) | 300 | 490 | 10 | 0 | 10 | 13.4 | 10.8 | 5.5 |
| HBr/O₂ RATIO (3) | 300 | 495 | 5 | 0 | 10 | 10.8 | 5.7 | 4.3 |
| HBr GAS ALONE | 300 | 500 | 0 | 0 | 10 | 13.2 | 12.4 | 11.9 |

METHOD OF MODIFYING ELECTROSTATIC CHUCK AND PLASMA PROCESSING APPARATUS

CROSS-REFERENCE TO RELATED APPLICATIONS

The present application is based on and claims priority to Japanese Patent Application No. 2012-271789 filed on Dec. 12, 2012, and U.S. Provisional Patent Application No. 61/739,309 filed on Dec. 19, 2012, the entire contents of which are hereby incorporated by reference.

BACKGROUND OF THE INVENTION

1. Field of the Invention

The present invention relates to a method of modifying an electrostatic chuck and a plasma processing apparatus.

2. Description of the Related Art

When a wafer etching process is performed using plasma, a reaction by-product is deposited on the inner wall surface of a processing chamber. When the thickness of the deposited reaction by-product reaches a predetermined thickness or greater, a portion of the deposited reaction by-product may peel off and turn into particles that may have adverse effects on the wafer etching process. Accordingly, a cleaning process for removing the deposited reaction by-product from the chamber and a process for adjusting the atmosphere within the chamber are periodically performed.

Recently, in efforts to reduce costs, the so-called waferless dry cleaning (also referred to as "WLDC" hereinafter) technique for cleaning a chamber without the use of a cleaning wafer is becoming widespread (see e.g., Patent Document 1). According to this technique, a waferless cleaning process is performed, and as a result, an electrostatic chuck is exposed to plasma during the cleaning process.

Particularly, when an etching process is performed on a silicon-based film, WLDC may be performed using a gas mixture of $SF_6$ gas and $O_2$ gas or a gas mixture of $CF_4$ gas and $O_2$ gas to remove a silicon-based reaction by-product deposited on the inner wall surface of the chamber. When the electrostatic chuck is exposed to plasma generated from such fluorine gases, the surface of the electrostatic chuck may be gradually fluorinated. For example, in a case where the surface of the electrostatic chuck is formed by a yttrium oxide ($Y_2O_3$) spray coating, the electrostatic chuck surface may be fluorinated and modified to yttrium fluorine (YF). YF has a lower volume resistivity compared to $Y_2O_3$. Accordingly, when the electrostatic chuck surface is modified to YF, a current flows more easily on the electrostatic chuck surface. Thus, when the electrostatic chuck surface is $Y_2O_3$, the electrostatic chuck generates a Coulomb force to attract a wafer, whereas when the electrostatic chuck surface is modified to YF, the electrostatic chuck also generates a Johnsen-Rahbek force to attract the wafer so that the electrostatic attraction force of the electrostatic chuck for attracting the wafer is increased. As a result, a torque exerted on a support pin upon separating the wafer from the electrostatic chuck (referred to as "pin torque" hereinafter) gradually increases and separation of the wafer from the electrostatic chuck may become more difficult. In turn, the wafer may be prone to bombardment-related damage or cracking upon separation from the electrostatic chuck.

In this respect, a technique is known for preventing such bombardment-related damage and cracking of the wafer by adjusting discharge conditions for separating the wafer according to an increase in the electrostatic attraction force (see e.g., PCT Japanese Translation Patent Publication No. 2008-519431).

However, when discharge conditions for separating the wafer are adjusted according to an increase in the electrostatic attraction force, a discharge time upon wafer separation may be increased and adjustment operations may have to be repeatedly performed. As a result, throughput may decrease and productivity may be degraded.

With respect to the above-mentioned problems, if the electrostatic chuck surface can be prevented from being fluorinated, the electrostatic attraction force may be prevented from increasing, the discharge time for separating the wafer may not have to be increased, adjustment operations as described above may not have to be performed, and productivity may be improved as a result.

Accordingly, there is a demand for a technique for preventing the surface of the electrostatic chuck from being fluorinated.

SUMMARY OF THE INVENTION

According to an embodiment of the present invention, a method of modifying an electrostatic chuck that electrostatically attracts a processing object is provided. The method includes a gas supplying step of supplying a gas containing hydrogen (H) and oxygen (O) into a chamber accommodating the electrostatic chuck having a surface that is fluorinated; and a modifying step of turning the gas supplied to the chamber into plasma using a high frequency power, exposing the electrostatic chuck to the plasma, and modifying the fluorinated surface of the electrostatic chuck.

In one preferred embodiment, the method may include a cleaning step of executing waferless dry cleaning of the chamber using a cleaning gas containing a fluorine-based gas, the cleaning step being executed before or after the modifying step.

In another preferred embodiment, the gas supplied to the chamber in the gas supplying step may include hydrogen bromide (HBr) gas and oxygen ($O_2$) gas.

In another preferred embodiment, a flow rate ratio of the oxygen gas with respect to the hydrogen bromide gas of the gas supplied to the chamber in the gas supplying step may be equal to a value within a range from 1/99 to 1/49.

In another preferred embodiment, a magnetic flux density of a magnetic field generated during the modifying step by a magnetic field generating mechanism arranged near the chamber may be adjusted to be higher than a magnetic flux density of a magnetic field generated by the magnetic field generating mechanism during the cleaning step.

In another preferred embodiment, the electrostatic chuck may include yttrium oxide ($Y_2O_3$) that is fluorinated at the surface of the electrostatic chuck.

In another preferred embodiment, the hydrogen (H) supplied to the chamber in the gas supplying step may bond with fluorine (F) on the surface of the electrostatic chuck, and the oxygen (O) supplied to the chamber in the gas supplying step may oxidize the surface of the electrostatic chuck.

In another preferred embodiment, the modifying step may be executed with respect to every lot.

According to another embodiment of the present invention, a plasma processing apparatus is provided that includes a chamber inside which a desired process is performed on a processing object; an electrostatic chuck that is arranged inside the chamber and is configured to electrostatically attract the processing object; a gas supply source that supplies gas into the chamber; and a control unit that controls the gas supply source to supply a gas containing hydrogen (H) and oxygen (O) to the chamber, turns the gas supplied to the chamber into plasma using a high frequency power, exposes the electrostatic chuck to the plasma, and modifies a fluorinated surface of the electrostatic chuck.

According to an aspect of the present invention, a method of modifying an electrostatic chuck and a plasma processing apparatus may be provided that can prevent the surface of the electrostatic chuck from being fluorinated.

BRIEF DESCRIPTION OF THE DRAWINGS

FIG. 13 is a table illustrating the pin torque upon wafer separation depending on a gas ratio of a gas used in a modifying step according to an embodiment of the present invention.

DESCRIPTION OF THE PREFERRED EMBODIMENTS

Figure 1:
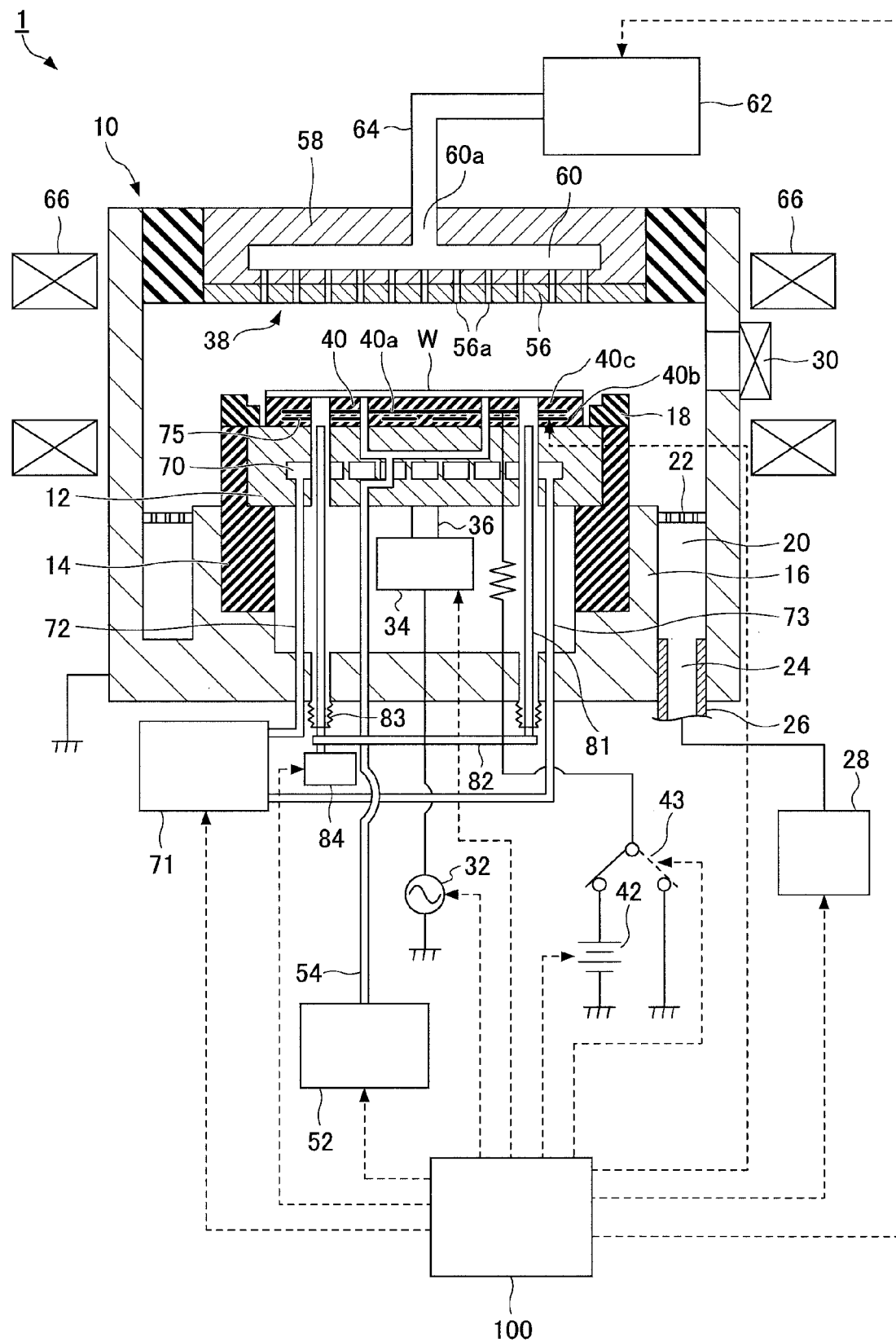
FIG. 1 illustrates an overall configuration of a plasma processing apparatus according to an embodiment of the present invention.

In the following, illustrative embodiments of the present invention are described with reference to the accompanying drawings. Note that in the descriptions and drawings, features that are substantially identical are given the same reference numerals and overlapping explanations thereof are omitted.

Embodiments of the present invention described below relate to a method of modifying an electrostatic chuck to prevent the surface of the electrostatic chuck from being fluorinated as a result of executing WLDC between wafer processes, and a plasma processing apparatus that is capable of executing such a modifying method. In the following, an overall configuration of a plasma processing apparatus according to an embodiment of the present invention is first described, after which a method of modifying an electrostatic chuck according to an embodiment of the present invention is described.

[Plasma Processing Apparatus Overall Configuration]

First, an overall configuration of a plasma processing apparatus according to an embodiment of the present invention is described with reference to FIG. 1.

The plasma processing apparatus 1 illustrated in FIG. 1 includes a metal cylindrical chamber (chamber) 10 that may be made of aluminum or stainless steel, for example. The chamber 10 is grounded. A plasma process such as an etching process is performed inside the chamber 10.

A stage 12 that is configured to hold a semiconductor wafer W (referred to as "wafer W" hereinafter) as a processing object is arranged inside the chamber 10. The stage 12 may be made of aluminum, for example, and is supported by a cylindrical support member 16, which extends vertically upward from the bottom of the chamber 10, via an insulating cylindrical holding member 14. A focus ring 18 that may be made of quartz, for example, is arranged to cover an upper face of the cylindrical holding member 14 and surround an upper face edge portion of the stage 12.

An exhaust path 20 is formed between an inner wall of the chamber 10 and an outer wall of the cylindrical support member 16. An annular baffle plate 22 is arranged at the exhaust path 20. An exhaust port 24 is arranged at a bottom portion of the exhaust path 20, and the exhaust port 24 is connected to an exhaust apparatus 28 via an exhaust pipe 26. The exhaust apparatus 28 includes a vacuum pump (not shown) and is configured to maintain the atmosphere within the chamber 10 to a predetermined degree of vacuum. A gate valve 30 that opens/closes upon loading/unloading the wafer W is arranged at the inner wall of the chamber 10.

A high frequency power supply 32 is electrically connected to the stage 12 via a feed rod 36 and a matching unit 34. The high frequency power supply 32 is configured to supply a high frequency power of 60 MHz, for example, to the stage 12. Accordingly, the stage 12 also acts as a lower electrode. A shower head 38 that acts as an upper electrode at ground potential is arranged at a ceiling portion of the chamber 10. The high frequency power from the high frequency power supply 32 for generating plasma is capacitively supplied between the stage 12 and the shower head 38.

An electrostatic chuck 40 that is configured to hold the wafer W by an electrostatic attracting force is arranged on an upper face of the stage 12. The electrostatic chuck 40 includes a sheet-type chuck electrode 40a made of a conductive film arranged between a pair of dielectric layers 40b and 40c corresponding to a dielectric member. The chuck electrode 40a is connected to a DC power supply 42 via a switch 43.

A Coulomb force is generated when a DC voltage is applied from the DC power supply 42 to the chuck electrode 40a so that the wafer W may be electrostatically attracted to the electrostatic chuck 40 by the Coulomb force. The DC voltage applied to the chuck electrode 40a may be turned off by operating the switch 43 so that the chuck electrode 40a may be grounded.

A heat transfer gas supply source 52 is configured to supply a heat transfer gas such as He gas or Ar gas to a backside of the wafer W placed on the electrostatic chuck 40 via a gas supply line 54. The shower head 38 includes an electrode plate 56 and an electrode support 58. The electrode plate 56 includes multiple gas holes 56a. The electrode support 58 detachably holds the electrode plate 56. A buffer chamber 60 is arranged within the electrode support 58. The buffer chamber 60 includes a gas introduction port 60a to which a gas supply source 62 is connected via a gas supply pipe 64. With such a configuration, a desired gas may be supplied within the chamber 1 from the shower head 38.

Multiple (e.g., three) support pins 81 for raising and lowering the wafer W are arranged within the stage 12 in order to enable transfer of the wafer W between external transfer arms (not shown). The multiple support pins 81 are configured to be moved up and down by a motor force that is transmitted thereto from a motor 84 via link member 82. Bottom belows 83 are arranged at through holes formed at the bottom of the chamber 10 for enabling passage of the support pins 81, and in this way, the interior of the chamber 10 may be maintained airtight.

Permanent magnets 66 that extend annularly or concentrically around the periphery of the chamber 10 are arranged one on top of the other in two tiers so that a vertical magnetic field may be generated by the chamber 10. The permanent magnets 66 may be movable up and down. By moving the permanent magnets 66 up and down, the intensity of the magnetic field on the wafer W may be adjusted. The permanent magnets 66 correspond to an exemplary embodiment of a magnetic field generating mechanism arranged near the chamber 10.

A RF electric field in the vertical direction is generated at a plasma generation space between the shower head 38 and the stage 12 by the high frequency power supply 32, and through high frequency discharge, plasma may be generated at a high density near the surface of the stage 12.

A coolant pipe 70 is arranged within the stage 12. A coolant at a predetermined temperature may be circulated from a chiller unit 71 to the coolant pipe 70 via pipes 72 and 73. Also, a heater 75 is arranged within the electrostatic chuck 40. A desired alternating current (AC) voltage may be applied to the heater 75 from an AC power supply. A processing temperature for processing the wafer W arranged on the electrostatic chuck 40 may be adjusted to a desired temperature through cooling by the chiller unit 71 and heating by the heater 75.

A control unit 100 controls operations of various parts of the plasma processing apparatus 1 such as the gas supply source 62, the exhaust apparatus 28, the heater 75, the DC power supply 42, the switch 43, the matching unit 34, the high frequency power supply 32, the heat transfer gas supply source 52, the motor 84, and the chiller unit 71. The control unit 100 is also connected to a host computer (not shown).

The control unit 100 may include a CPU (Central Processing Unit), a ROM (Read Only Memory) and a RAM (Random Access Memory) (not shown), for example. The CPU may execute a plasma process according to various recipes stored in the storage areas of the control unit 100. The recipes may describe apparatus control information according to various processing conditions. For example, the recipes may include information relating to processing time, processing chamber temperature (e.g., upper electrode temperature, side wall temperature of processing chamber, ESC temperature), pressure (gas exhaust), high frequency power and voltage, processing gas flow rate of various processing gases, and heat transfer gas flow rate.

In the case of performing an etching process at the plasma processing apparatus 1 having the above-described configuration, first, the gate valve 30 is opened and a wafer W that is held by a transfer arm is loaded into the chamber 10. Then, the wafer W is lifted from the transfer arm by the support pins 81 that protrude from the surface of the electrostatic chuck 40 so that the wafer W may be held by the support pins 81. Then, the transfer arm exits the chamber 10, and the support pins 81 move downward to be accommodated inside the electrostatic chuck 40 so that the wafer W may be placed on the electrostatic chuck 40.

After the wafer W is loaded into the chamber 10, the gate valve 30 is closed and an etching gas is introduced into the chamber 10 at a predetermined flow rate from the gas supply source 62. Also, the exhaust apparatus 28 reduces the pressure within the chamber 10 to a predetermined value. Further, a predetermined high frequency power is supplied to the stage 12 from the high frequency power supply 32. Additionally, a voltage from the DC power supply 42 is applied to chuck electrode 40a of the electrostatic chuck 40 so that the wafer W may be electrostatically attracted to the electrostatic chuck 40. The etching gas that is showered into the chamber 10 from the shower head 38 is turned into plasma by the high frequency power from the high frequency power supply 32. In this way, a main face of the wafer W may be etched by radicals and ions contained in the generated plasma.

In the case of separating (de-chucking) the wafer W from the electrostatic chuck 40 after the plasma etching process is completed, the supply of the heat transfer gas is stopped, and an inert gas is supplied to the chamber 10 to maintain the pressure within the chamber 10 to a predetermined pressure. Meanwhile, an opposite-polarity voltage of the voltage applied to the chuck electrode 40a during the plasma etching process is applied to the chuck electrode 40a after which the voltage application is stopped. In this way, a discharge process for discharging residual electric charge at the electrostatic chuck 40 and the wafer W is performed. Then, the support pins 81 are raised to lift the wafer W from the electrostatic chuck 40, and the wafer W is separated from the electrostatic chuck 40. After the gate valve 30 is opened and a transfer arm is introduced into the chamber 10, the support pins 81 are lowered so that the wafer W may be held by the transfer arm. Then, the transfer arm exits from the chamber 10, and a next wafer W is loaded into the chamber 10 by a transfer arm. By repeating the above processes, multiple wafers W may be successively processed by the plasma processing apparatus 1. The overall configuration of the plasma processing apparatus 1 has been described above.

[Change in Electrostatic Attraction Force of Electrostatic Chuck]

Figure 2:
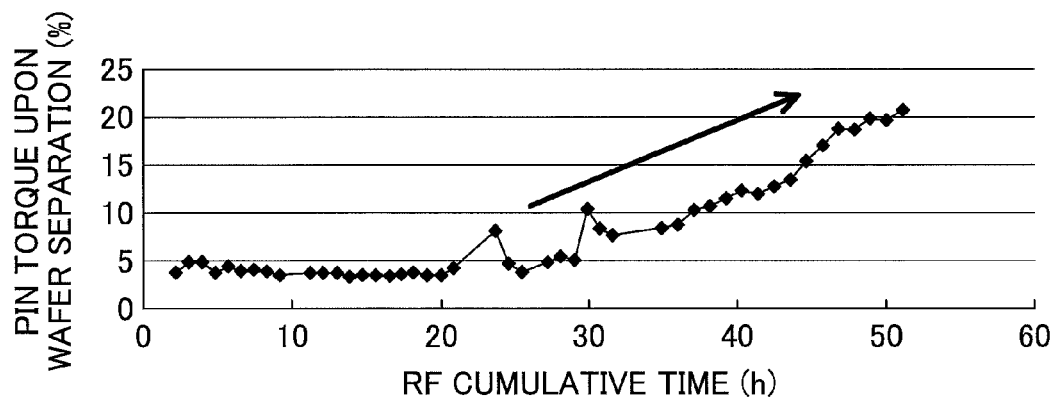
FIG. 2 is a graph illustrating a pin torque upon wafer separation according to a RF cumulative time.

Next, a change in the electrostatic attraction force of the electrostatic chuck 40 over time is described with reference to experimental results illustrated in FIG. 2. FIG. 2 is a graph illustrating a change in the pin torque upon wafer separation according to a RF cumulative time. In the graph of FIG. 2, the horizontal axis represents the RF cumulative time (h) of applying high frequency power (RF power) to the lower electrode (stage 12) of the plasma processing apparatus 1, and the vertical axis represents the pin torque upon wafer separation (%). The pin torque upon wafer separation (%) represents a load required for separating the wafer W assuming the rated torque of a support pin motor is equal to 100%.

First, processing conditions implemented in the present experiment are described. In the present experiment, a plasma process (wafer process) was performed using a silicon substrate having a silicon dioxide film formed thereon as a dummy wafer. After the plasma process, a gas mixture of $CF_4$ (carbon tetrafluoride) gas and $O_2$ (oxygen) gas was used to perform WLDC. In other words, WLDC was performed each time a wafer was processed. Also, a process for adjusting the atmosphere within the chamber 10 was performed as necessary. Note that the above WLDC and the process of adjusting the atmosphere within the chamber 10 may be included in a cleaning step of an embodiment of the present invention that includes executing waferless dry cleaning of the chamber using a cleaning gas containing fluorine-based gas.

When the WLDC and the process of adjusting the atmosphere within the chamber 10 are performed, the surface of the electrostatic chuck 40 is exposed to plasma generated from the fluorine-based gas and the electrostatic chuck surface is gradually fluorinated as a result. As illustrated in FIG. 2, up to a certain point, the electrostatic chuck surface may be prevented from being fluorinated to such a great extent, and the pin torque upon wafer separation (i.e., torque exerted on the support pins 81 illustrated in FIG. 1 when the wafer W is separated from the electrostatic chuck 40) may be maintained at a relatively low level up to such a point. However, from a certain point (around the point where the RF cumulative time equals 30 hours in FIG. 2), the electrostatic chuck surface starts being fluorinated at an increasingly faster rate, and the pin torque starts increasing from this point.

Accordingly, after the RF cumulative time exceeds 30 hours, the required discharge time for separating the wafer from the electrostatic chuck 40 increases as the RF cumulative time increases, and throughput is degraded as a result. Also, when the pin torque upon wafer separation increases, the wafer may be more prone to bombardment-related damage and cracking.

In light of the above, if the pin torque upon wafer separation may be prevented from increasing, throughput degradation may be prevented, and the risk of bombardment-related damage and cracking of the wafer may be reduced.

Figure 3:
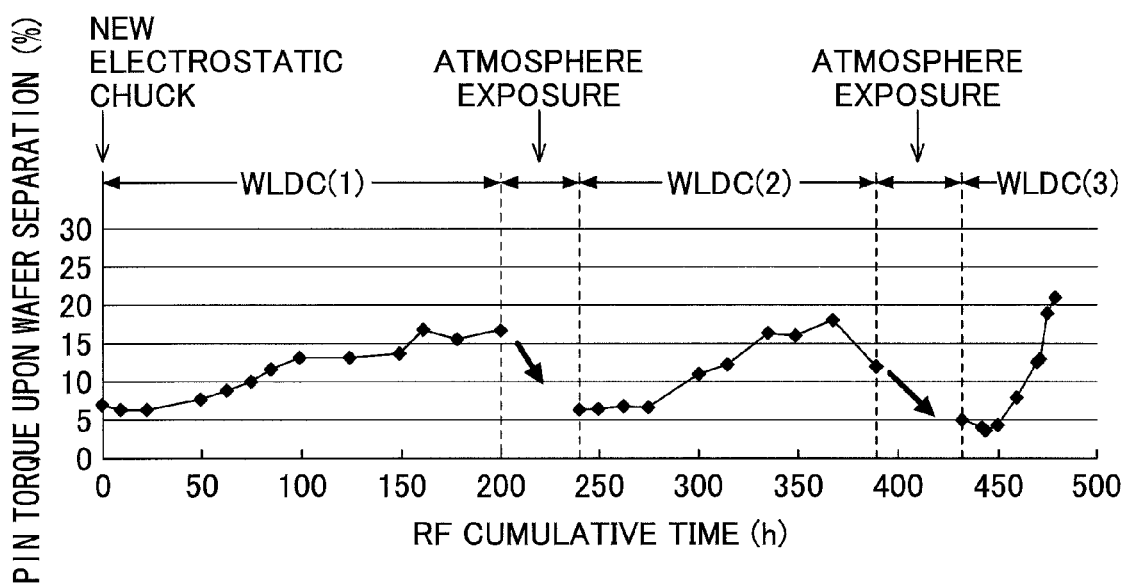
FIG. 3 is a graph illustrating a change in the pin torque upon wafer separation when the plasma processing apparatus is exposed to the atmosphere.

In FIG. 3, the cycle of dummy wafer process→WLDC-→dummy wafer process was repeatedly performed during a time period indicated by WLDC (1). During this time period, the electrostatic chuck surface was gradually fluorinated. At the point where the RF cumulative time reached 200 hours, the pin torque upon wafer separation increased to a point where the risk of the wafer being damaged became too high such that wafer processing under the same processing conditions became impossible. Thus, for maintenance purposes, the plasma processing apparatus 1 was exposed to the atmosphere. As a result, the pin torque was decreased to a level close to that when the electrostatic chuck 40 was new.

Then, the cycle of dummy wafer process→WLDC-→dummy wafer process was repeatedly performed again during a time period indicated by WLDC (2) in FIG. 3. At the point where the RF cumulative time reached 390 hours, the plasma processing apparatus 1 was exposed to the atmosphere once again. As a result, the pin torque was once more decreased to a level close to that when the electrostatic chuck 40 was new.

As can be appreciated, the pin torque may decrease once the interior of the plasma processing apparatus 1 is exposed to the atmosphere. Based on the above, the inventors of the present invention predicted that at least one of (1) a high pressure state (atmospheric pressure), and (2) moisture ($H_2O$, H, O) within the atmosphere have an effect on decreasing the pin torque.

Figure 4:
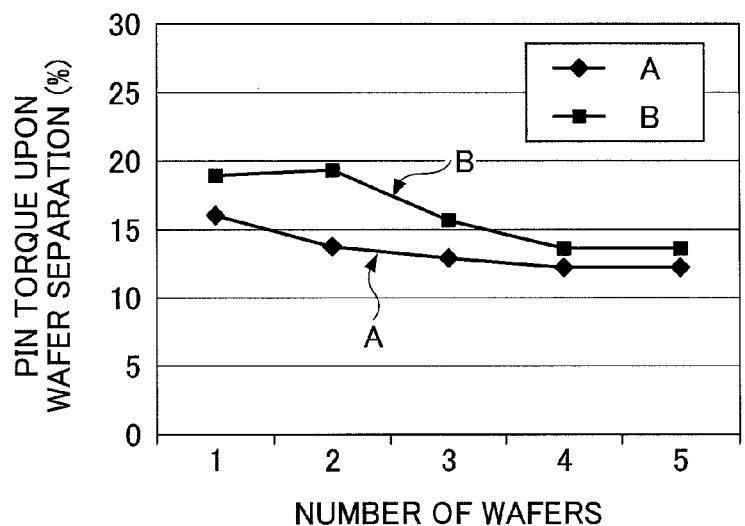
FIG. 4 is a graph illustrating a change in the pin torque upon wafer separation depending on whether the plasma processing apparatus is purged with nitrogen.

Accordingly, first, to test whether (1) a high pressure state (atmospheric pressure) has an effect on decreasing the pin torque, the chamber 10 was purged with nitrogen ($N_2$), adjusted to a high pressure state (atmospheric pressure), and left in such as state for ten minutes. FIG. 4 illustrates the results of conducting such an experiment. In the graph of FIG. 4, the horizontal axis represents the number of wafers, and the vertical axis represents the pin torque upon wafer separation. In FIG. 4, line B represents the pin torque upon wafer separation for five wafers in the case where the chamber 10 was purged with $N_2$ and adjusted to a high pressure state (atmospheric pressure). On the other hand, line A of FIG. 4 represents the pin torque upon wafer separation for five wafers in the case where the chamber 10 was not purged with $N_2$ (at a low pressure state). By comparing these two results, it can be appreciated that the pin torque did not decrease even when the chamber 10 was purged with $N_2$ and adjusted to a high pressure state (atmospheric pressure) and was in fact slightly increased. Based on these results, the inventors reached the conclusion that the pressure change within the chamber 10 resulting from exposing the plasma processing apparatus 1 to the atmosphere does not have an effect on decreasing the pin torque. Thus, it was predicted that (2) moisture within the atmosphere resulting from exposing the plasma processing apparatus 1 to the atmosphere has some effect on decreasing the pin torque.

[Modifying Step]

Accordingly, to test the effect of the moisture within the atmosphere on decreasing the pin torque, differences in experimental results were considered between a case where a plasma process step using a gas containing hydrogen (H) and oxygen (O) was performed at a predetermined timing between wafer processes, and a case where such a plasma process step was not performed. Note that in the following descriptions, the plasma process step of turning a gas containing hydrogen (H) and oxygen (O) into plasma using a high frequency power and exposing the electrostatic chuck to the plasma to modify the surface of the electrostatic chuck may also be referred to as "modifying step."

(Gas Type)

Figure 5:
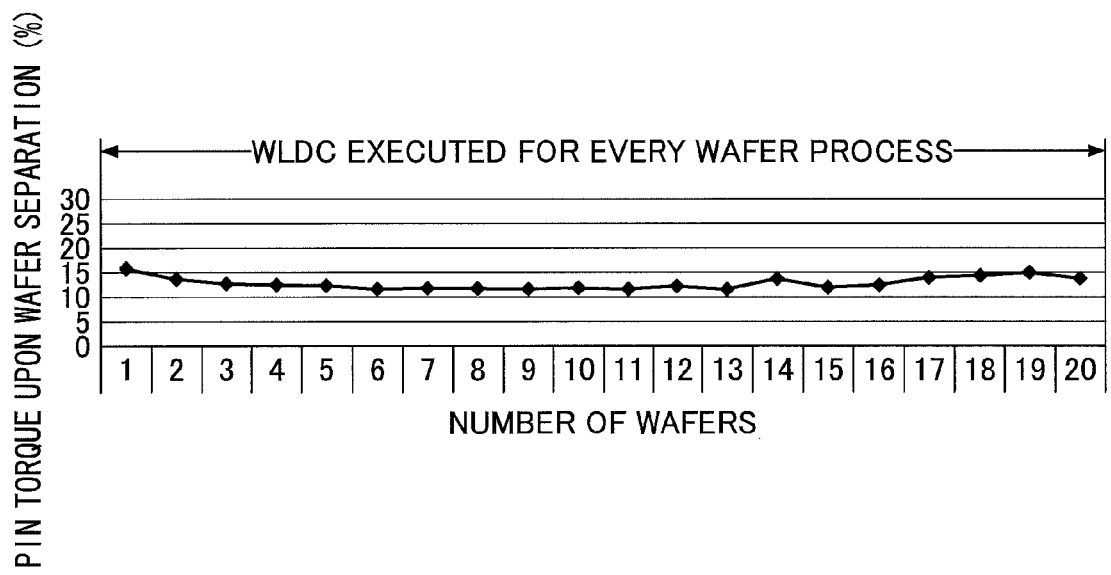
FIG. 5 is a graph illustrating the pin torque upon wafer separation when a modifying step is not executed.

FIG. 5 illustrates experimental results of a case where WLDC using $CF_4$ gas and $O_2$ gas was performed with respect to every wafer process but a modifying step was not performed. The processing conditions of the WLDC implemented in this case are indicated below.

<WLDC Processing Conditions>

| Pressure | 400 mT (53.3 Pa) |
|---|---|
| Power | High frequency power for plasma: 750 W |
| | High frequency power for biasing: 0 W |
| Magnetic Field | 56 G ($5.6^{-2}$ T) |
| Gas Type & Gas Ratio | $CF_4$ gas/$O_2$ gas<br>$CF_4$ gas:$O_2$ gas = 1:1 |
| Processing Time | 25 minutes |

In FIG. 5, the horizontal axis represents the number of wafers, and the vertical axis represents the pin torque upon wafer separation (%). A discharge time for wafer separation was adjusted so that the pin torque upon wafer separation for the first five wafers (i.e., first through fifth wafers) may be approximately 12-17%.

FIG. 5 illustrates how the pin torque upon wafer separation (%) changes over time in the case where WLDC is executed every time one wafer is processed. According to the illustrated results, the pin torque upon wafer separation for each of twenty wafers was approximately 13-15%.

Figure 6:
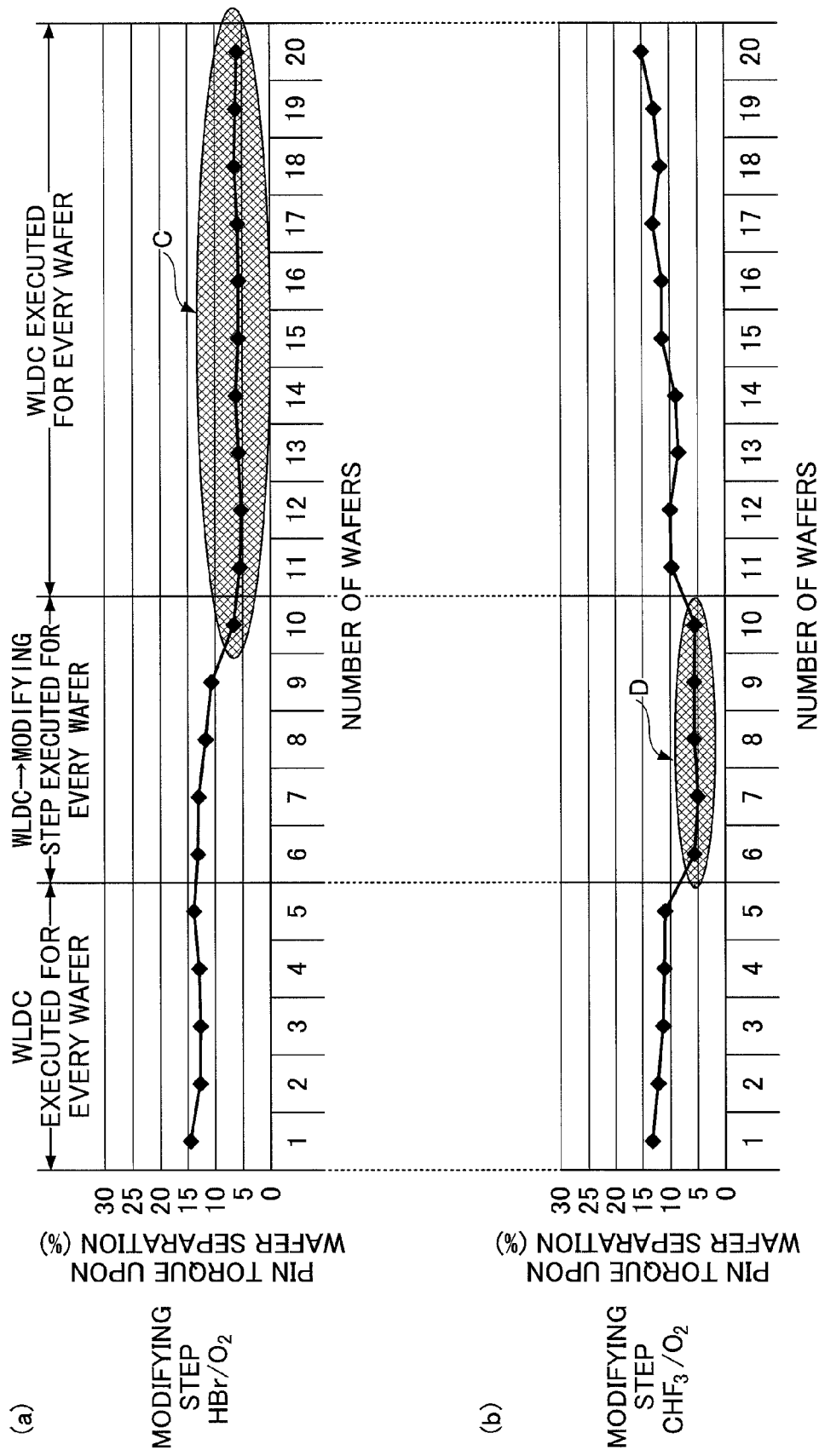
FIG. 6 is a graph illustrating the pin torque upon wafer separation when a modifying step according to an embodiment of the present invention is executed.

In an experiment illustrated in FIG. 6, WLDC was executed for every wafer process with respect to the first five wafers (first through fifth wafers). With respect to the next five wafers (sixth through tenth wafer), a cleaning step (first step) of executing WLDC using a gas mixture of $CF_4$ gas and $O_2$ gas and a modifying step (second step) using a gas containing hydrogen (H) and oxygen (O) were performed for every wafer process. With respect to the last ten wafers (eleventh through twentieth wafers), WLDC was similarly executed for every wafer process but the modifying step was not performed. Note that FIG. 6(a) illustrates a case where a gas mixture of HBr (hydrogen bromide) gas and $O_2$ gas was used in the modifying step. FIG. 6(b) illustrates a case where a gas mixture of $CH_3$ (trifluoromethane) gas and $O_2$ gas was used in the modifying step.

The WLDC processing conditions implemented in FIG. 6 were identical to the WLDC processing conditions implemented in FIG. 5. The processing conditions of the modifying step implemented with respect to the sixth through tenth wafers in FIG. 6 are indicated below.

<Modifying Step Processing Conditions when Using HBr Gas+$O_2$ Gas>

| | |
|---|---|
| Pressure | 300 mT (40.0 Pa) |
| Power | High frequency power for plasma: 450 W |
| | High frequency power for biasing: 0 W |
| Magnetic Field | 320 G ($3.2^{-1}$ T) |
| Gas Type & Gas Ratio | HBr gas/$O_2$ gas |
| | HBr gas:$O_2$ gas = 49:1 |
| Processing Time | 10 seconds |

<Modifying Step Processing Conditions when Using $CH_3$ Gas+Ar Gas+$O_2$ Gas>

| | |
|---|---|
| Pressure | 300 mT (40.0 Pa) |
| Power | High frequency power for plasma: 450 W |
| | High frequency power for biasing: 0 W |
| Magnetic Field | 320 G ($3.2^{-1}$ T) |
| Gas Type & Gas Ratio | $CH_3$ gas/Ar gas/$O_2$ gas |
| | $CH_3$ gas:Ar gas:$O_2$ gas = 24:25:1 |
| Processing Time | 10 seconds |

Note that Ar gas is contained in the above gas mixture for the purpose of securing an overall flow rate based on other conditions of the process. However, the Ar gas does not have to be included if an overall flow rate may be secured based on the other conditions.

As can be appreciated, by executing the modifying step of FIG. 6(a) using a gas mixture of HBr gas and $O_2$ gas, the pin torque upon wafer separation for the sixth through tenth wafers gradually decreased from approximately 15% to 5%. With respect to the wafers after the eleventh wafer, the pin torque upon wafer separation was maintained at approximately 5% even through only WLDC was executed and the modifying step was not executed (see portion C of FIG. 6(a)).

Also, by executing the modifying step of FIG. 6(b) using a gas mixture of $CH_3$ gas and $O_2$ gas, the pin torque upon wafer separation for the sixth through tenth wafers decreased to 5% (see portion D of FIG. 6(b)). With respect to the wafers after the eleventh wafer, for which only WLDC was executed and the modifying step was not executed, the pint torque upon wafer separation gradually increased from 5% to approximately 10-15%.

As can be appreciated from the above, as the surface of the electrostatic chuck 40 is gradually fluorinated through execution of WLDC, the pin torque upon wafer separation increases accordingly. However, when a modifying step is performed at a predetermined timing, the pin torque may decrease from approximately 15% down to 5%. These experimental results support the conclusion that a modifying step using a gas containing hydrogen (H) and oxygen (O) can prevent an increase in the pin torque upon wafer separation.

Also, note that the manner in which the pin torque characteristics were improved was different depending on whether a HBr gas was used or CHxFy gas was used in the modifying step. In the case where a gas mixture of $CH_3$ gas and $O_2$ gas was used in the modifying step as illustrated in FIG. 6(b), effects of the modifying step were immediate and the pin torque upon wafer separation decreased immediately. However, the pin torque upon wafer separation increased once execution of the modifying step was stopped indicating that the effects of the modifying step may not be maintained in this case. On the other hand, in the case where a gas mixture of HBr gas and $O_2$ gas was used in the modifying step as illustrated in FIG. 6(a), torque improvement effects of the modifying were not as immediate as the case of using CHxFy gas. However, in this case, the pin torque upon wafer separation could be prevented from increasing even after execution of the modifying step was stopped, indicating that the effects of the modifying step may be maintained. Thus, HBr gas may preferably be used over CHxFy gas in the modifying step. That is, by using HBr in the modifying step, the frequency at which the two steps including the WLDC and the modifying step have to be performed may be reduced compared to the case of using a CHxFy gas, and as a result, throughput and productivity may be improved.

(Gas Ratio/Magnetic Field)

Figure 7:
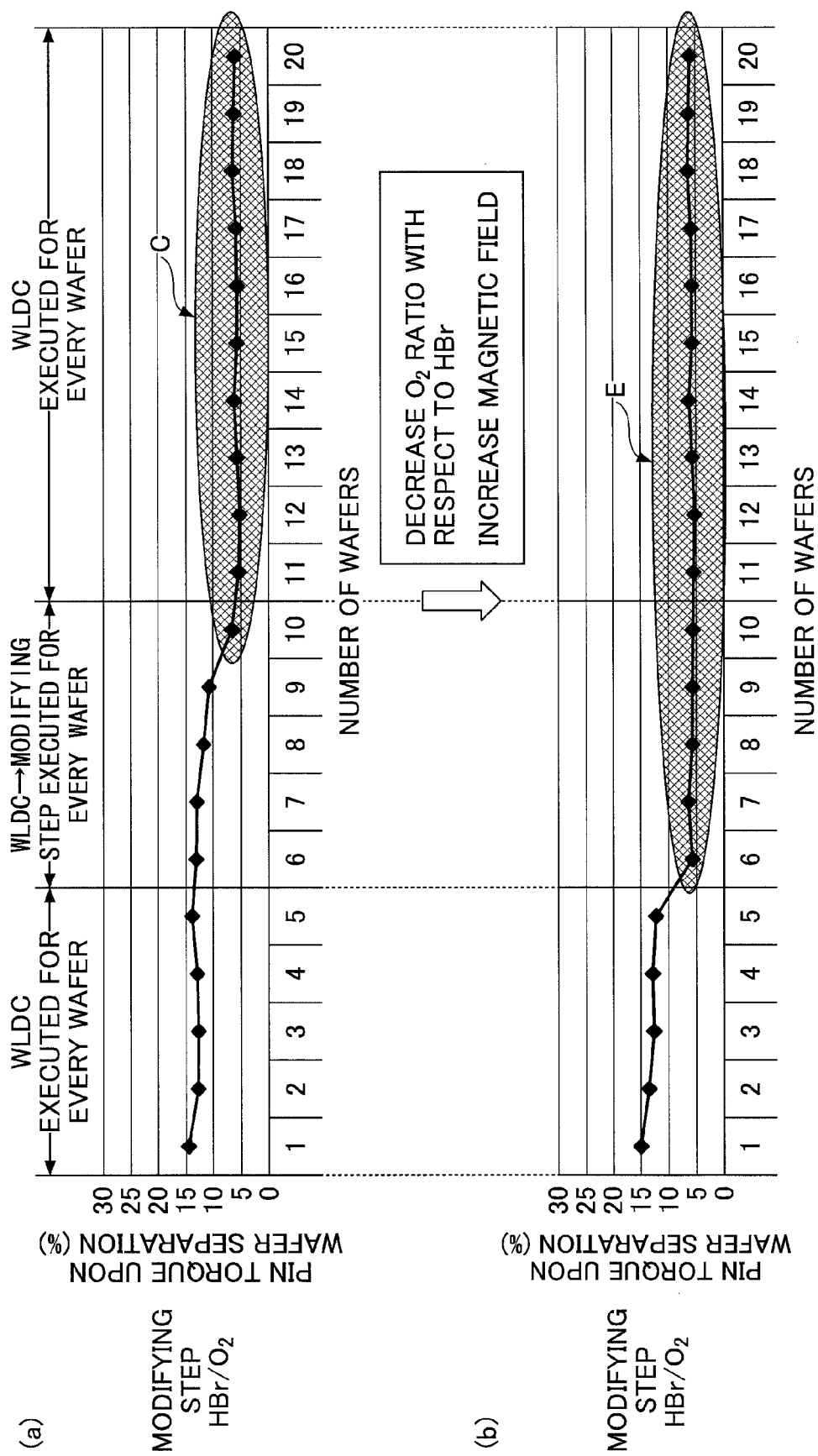
FIG. 7 is a graph illustrating how a ratio of $O_2$ gas with respect to HBr gas and a magnetic field used in the modifying step affects the pin torque upon wafer separation.

Next, experiments were conducted to examine the effects of the HBr-to-$O_2$ gas ratio and the magnetic field on the pin torque when executing the modifying step using HBr gas. The experimental results are analyzed below with reference to FIG. 7. Note that FIG. 7(a) is identical to FIG. 6(a) and is illustrated for the purpose of facilitating comparison with the experimental results of FIG. 7(b). In FIG. 7(a) and FIG. 7(b), WLDC was executed for every wafer process with respect to the first five wafers (first through fifth wafer) in a manner similar to FIG. 6. With respect to the next five wafers (sixth through tenth wafers), a cleaning step (first step) of executing WLDC using a gas mixture of $CF_4$ gas and $O_2$ gas and a modifying step (second step) using a gas mixture of HBr gas and $O_2$ gas were performed for every wafer process. With respect to the last ten wafers (eleventh through twentieth wafers), WLDC was similarly executed for every wafer process but the modifying step was not performed. Note that the WLDC processing conditions implemented in the present experiment were identical to the WLDC processing conditions implemented in the experiments of FIGS. 5 and 6. The processing conditions of the modifying steps implemented in FIG. 7(a) and FIG. 7(b) are indicated below.

<Modifying Step Processing Conditions for FIG. 7(a)>

| | |
|---|---|
| Pressure | 300 mT (40.0 Pa) |
| Power | High frequency power for plasma: 450 W |
| | High frequency power for biasing: 0 W |
| Magnetic Field | 320 G ($3.2^{-1}$ T) |
| Gas Type & Gas Ratio | HBr gas/$O_2$ gas |
| | HBr gas:$O_2$ gas = 49:1 |
| Processing Time | 10 seconds |

<Modifying Step Processing Conditions for FIG. 7(b)>

| | |
|---|---|
| Pressure | 300 mT (40.0 Pa) |
| Power | High frequency power for plasma: 450 W |
| | High frequency power for biasing: 0 W |
| Magnetic Field | 454 G (4.54$^{-1}$ T) |
| Gas Type & Gas Ratio | HBr gas/O$_2$ gas |
| | HBr gas:O$_2$ gas = 99:1 |
| Processing Time | 10 seconds |

Note that in the modifying step of FIG. 7(a), the ratio of O$_2$ gas with respect to HBr gas is higher and the magnetic field is smaller than FIG. 7(b), and in the modifying step of FIG. 7(b), the ratio of O$_2$ gas with respect to HBr gas is lower and the magnetic field is greater than FIG. 7(a). As can be appreciated, different torque improvement effects were observed from the above two cases. Specifically, as illustrated in FIG. 7(b), in the case where the ratio of O$_2$ gas with respect to HBr gas was lower and the magnetic field was greater, the torque improvement effects were more immediate than the case of FIG. 7(a), and the pin torque upon wafer separation decreased immediately (see portion E of FIG. 7(b)). Further, even after execution of the modifying step was terminated, the pin torque upon wafer separation was prevented from increasing indicating that effects of the modifying step may be maintained in this case (see portion E of FIG. 7(b)).

It can be appreciated from the above experimental results that the effects of the modifying step may be enhanced by increasing the magnetic field in the modifying step. Note that as the magnetic field is increased, the plasma density on the electrostatic chuck becomes lower. Based on the above, the plasma density on the wafer may presumably be controlled more accurately and the effects of the modifying step may be enhanced as a result. Note that the magnetic flux density of the magnetic field generated by the permanent magnets 66 in the modifying step may be any value that is higher than the magnetic flux density of the magnetic field generated by the permanent magnets 66 in the cleaning step that is executed before or after the modifying step.

Also, the above experimental results indicate that the effects of the modifying step may be obtained immediately and maintained longer when the ratio of O$_2$ gas with respect to HBr gas is lower. The underlying reasons for such an effect are described below with reference to FIG. 13.

As described above, by lowering the ratio of O$_2$ gas with respect to HBr gas and using a high magnetic field in a modifying step, the effects of the modifying step on decreasing the pin torque upon wafer separation may be obtained more immediately, and a low torque may be maintained for a longer period of time after execution of the modifying step is stopped. In this way, throughput and productivity may be improved.

[Modifying Step Executed at Lot Process End Time]

Figure 8:
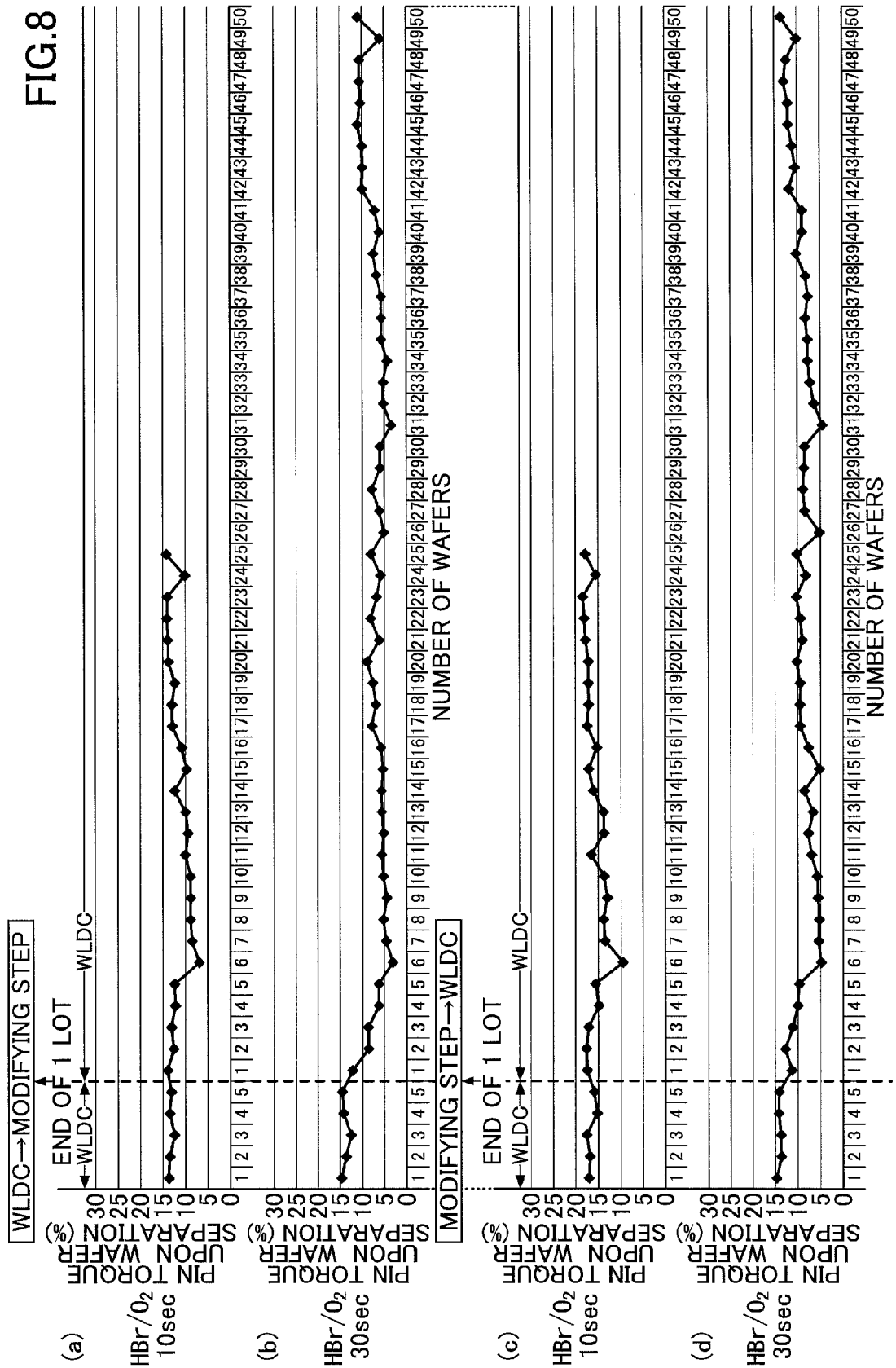
FIG. 8 is a graph illustrating effects of the modifying step depending on processing conditions.

When the cleaning step and the modifying step are executed for every wafer process, the throughput per wafer becomes lower and productivity is decreased. Accordingly, an experiment was conducted to examine whether the above pin torque decreasing effect may be obtained without decreasing throughput and productivity if the modifying step were executed after wafer processing of one lot is completed. FIG. 8 illustrates the experimental results of such an experiment.

In the present experiment, WLDC was executed for every wafer process with respect to the first five wafers (first through fifth wafers). Note that a dotted line drawn at the end of the fifth wafer in FIG. 7 indicates the end of one lot. At this time, two steps including the WLDC and the modifying step using a gas mixture of HBr gas and O$_2$ gas were executed.

At times other than the end of one lot indicated by the dotted line in FIG. 7, the WLDC was executed but the modifying step was not executed. Note that the WLDC was executed for every wafer process in all of the illustrated lots.

In FIG. 8(a) and FIG. 8(b), the two steps were executed in the sequence WLDC→modifying step at the end of one lot. In FIG. 8(c) and FIG. 8(d), the two steps were executed in the sequence modifying step→WLDC. Also, the processing time of the modifying step executed in FIG. 8(a) and FIG. 8(c) was 10 seconds, and the processing time of the modifying step executed in FIG. 8(b) and FIG. 8(d) was 30 seconds. The processing time of the WLDC was 25 seconds in all of the above cases. The WLDC processing conditions and the other modifying step conditions implemented in the present experiment are indicated below.

<WLDC Processing Conditions>

| | |
|---|---|
| Pressure | 400 mT (53.3 Pa) |
| Power | High frequency power for plasma: 750 W |
| | High frequency power for biasing: 0 W |
| Magnetic Field | 56 G (5.6$^{-2}$ T) |
| Gas Type & Gas Ratio | CF$_4$ gas/O$_2$ gas |
| | CF$_4$ gas:O$_2$ gas = 1:1 |
| Processing Time | 25 seconds |

<Modifying Step Processing Conditions>

| | |
|---|---|
| Pressure | 300 mT (40.0 Pa) |
| Power | High frequency power for plasma: 450 W |
| | High frequency power for biasing: 0 W |
| Magnetic Field | 454 G (4.54$^{-1}$ T) |
| Gas Type & Gas Ratio | HBr gas/O$_2$ gas |
| | HBr gas:O$_2$ gas = 99:1 |

As can be appreciated from FIG. 8, the effect of decreasing the pin torque upon wafer separation was greater when the processing time of the modifying step executed at the end of one lot was 30 seconds as illustrated in FIG. 8(b) and FIG. 8(d) compared to the case where the processing time of the modifying step was 10 seconds as illustrated in FIG. 8(a) and FIG. 8(c).

With respect to the differences in the pin torque decrease observed in FIG. 8(b) and FIG. 8(d), in the case where WLDC was executed for 25 seconds after which the modifying step (HBr gas+O$_2$ gas) was executed for 30 seconds as in FIG. 8(b), the pin torque upon wafer separation could be maintained at a desirably low level for the next 40 wafer processes performed after execution of the WLDC→modifying step. That is, after executing the modifying step, approximately 40 product wafers could be separated from the electrostatic chuck under normal discharge conditions.

In the case where the modifying step (HBr gas+O$_2$ gas) was executed for 30 seconds after which WLDC was executed for 25 seconds as in FIG. 8(d), the pin torque upon wafer separation could be maintained at a low level for the next 40 wafers processed after execution of the modifying step→WLDC. However, ameliorative effects on the pin torque in this case were weaker than the ameliorative effect obtained in FIG. 8(b). This may be attributed to a small time gap created before execution of the WLCD using the gas mixture of $CF_4$ gas and $O_2$ gas. During such time gap, the temperature of parts within the chamber may decrease and the temperature of the electrostatic chuck may also decrease. Such a temperature decrease is believed to decelerate the modification of the electrostatic chuck surface in the modifying step of FIG. 8(d) compared to FIG. 8(b). The above findings support a conclusion that ameliorative effects on the pin torque upon wafer separation may be further enhanced by executing the two steps in the sequence WLDC→modifying step as in FIG. 8(b) rather than executing the two steps in the sequence modifying step→WLDC as in FIG. 8(d).

It can be appreciated from above that in the case of executing a modifying step after the end of one lot, the modifying step is preferably executed for 30 seconds rather than 10 seconds. Also, when the modifying step is executed after the end of one lot, the pin torque upon wafer separation may decrease whether process steps are executed in the sequence WLDC→modifying step or modifying step-→WLDC. However, modification of the electrostatic surface may be further accelerated when the process steps are executed in the sequence WLDC→modifying step.

[Modifying Step Executed for Every Lot]

Next, experimental results of executing a modifying step for every lot are described with reference to FIG. 9. In the present experiment, WLDC using a gas mixture of $CF_4$ gas and $O_2$ gas was executed for every wafer process. Also, with respect to every lot, before starting a wafer process on the first wafer of the lot, WLDC using a gas mixture of $CF_4$ gas and $O_2$ gas was executed for 25 seconds after which a modifying step using a gas mixture of HBr gas and $O_2$ gas was executed for 10 seconds. Note that in the present experiment, 25 wafers were processed in each lot.

Figure 9:
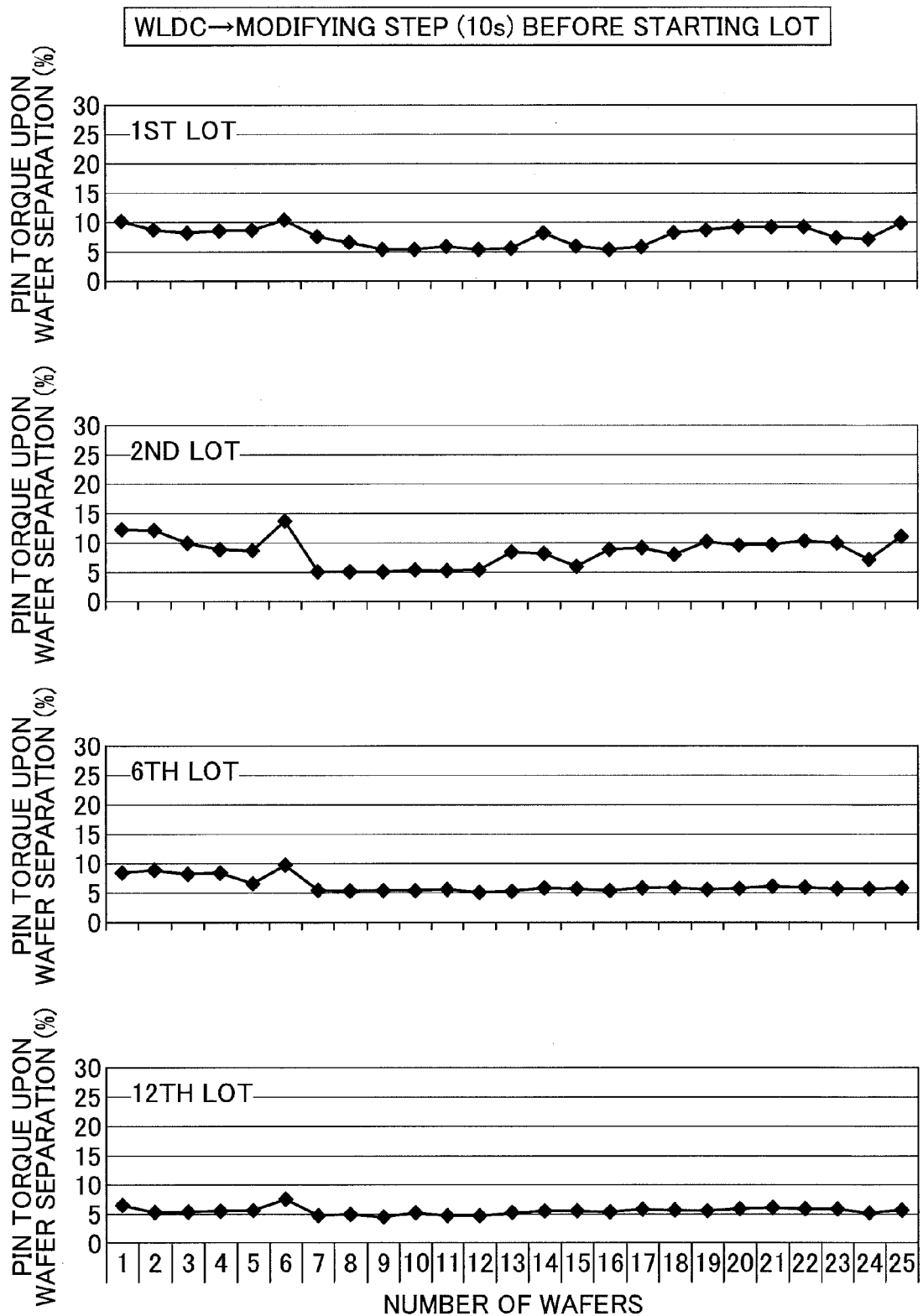
FIG. 9 is a graph illustrating effects of executing the modifying step with respect to every lot in one exemplary manner.

FIG. 9 illustrates the experimental results of executing the modifying step as described above. Specifically, FIG. 9 illustrates the pin torque upon wafer separation for the 25 wafers of a first lot, a second lot, a sixth lot, and a twelfth lot. It can be appreciated from FIG. 9 that the pin torque upon wafer separation tends to decrease as the lot number increases.

Figure 10:
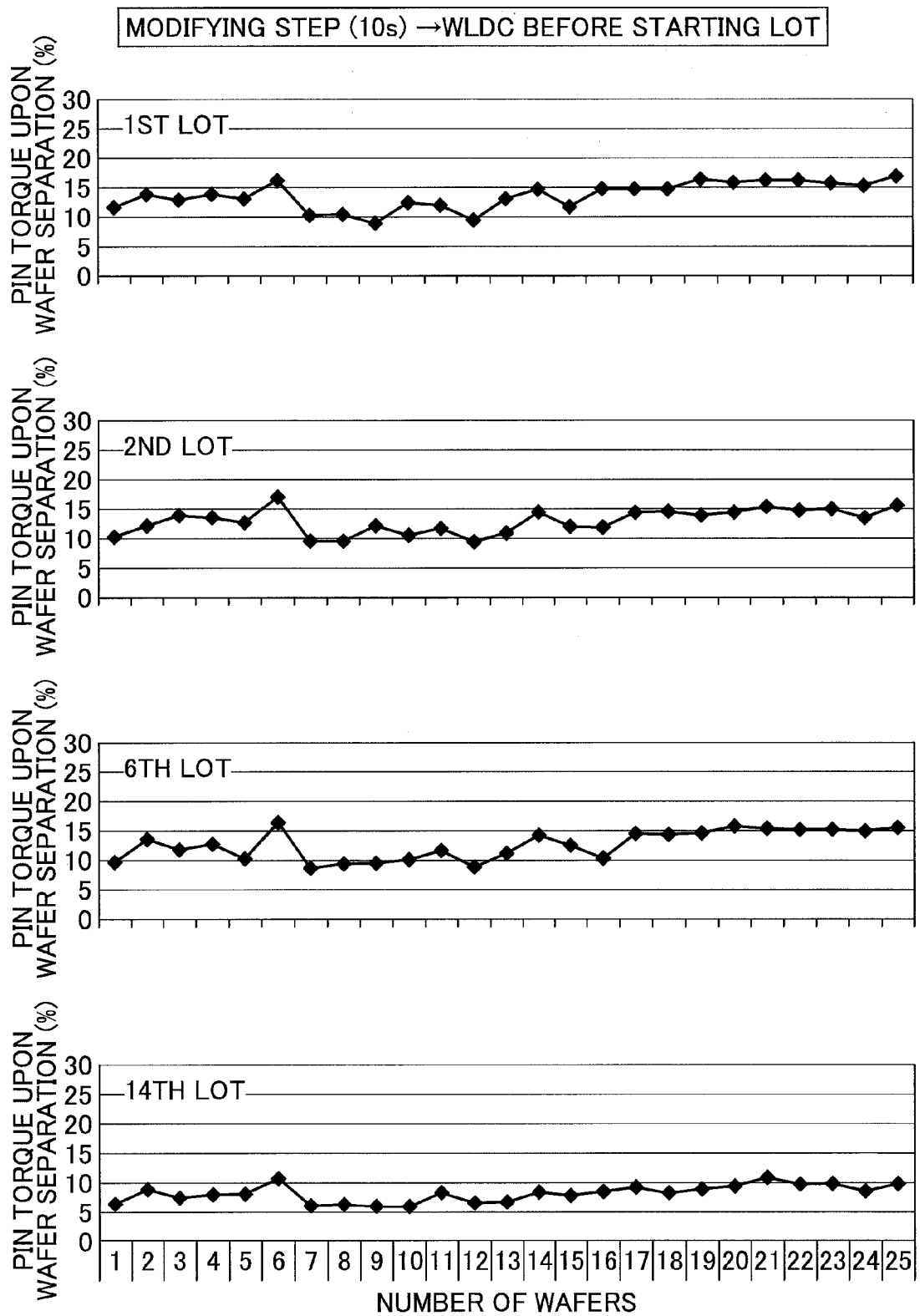
FIG. 10 is a graph illustrating effects of executing the modifying step with respect to every lot in another exemplary manner.

FIG. 10 illustrates experimental results of a similar experiment of executing a modifying step for every lot. In the present experiment, WLDC using a gas mixture of $CF_4$ gas and $O_2$ gas was executed for every wafer process. Also, with respect to every lot, before starting a wafer process on the first wafer of the lot, a modifying step using a gas mixture of HBr gas and $O_2$ gas was executed for 10 seconds after which WLDC using a gas mixture of $CF_4$ gas and $O_2$ gas was executed for 25 seconds. Note that in the present experiment, 25 wafers were processed in each lot.

FIG. 10 illustrates the pin torque upon wafer separation for the 25 wafers of a first lot, a second lot, a sixth lot, and a fourteenth lot. It can be appreciated from FIG. 10 that the pin torque upon wafer separation tends to decrease as the lot number increases.

The above experimental results indicate that by executing a modifying step for 10 seconds with respect to every lot, the pin torque upon wafer separation may be maintained at a low level regardless of whether the modifying step is executed before or after the WLDC step.

Note that the pin torque upon wafer separation decreased at a higher rate when the modifying step was executed after the WLDC step compared to when the modifying step was executed before the WLDC step. However, even in the case where the modifying step was executed before the WLDC step, as the lot number increased, the pin torque upon wafer separation decreased to a level close to that obtained when the modifying step was executed after the WLDC step.

Figure 11:
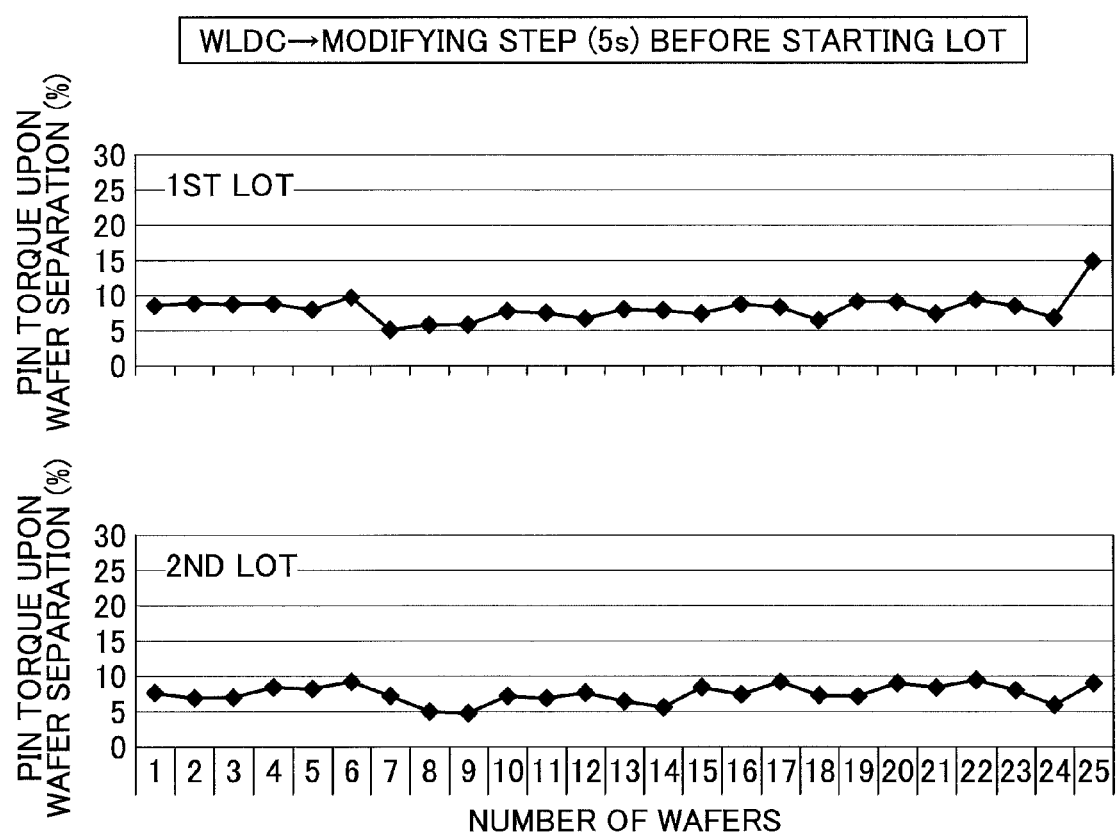
FIG. 11 is a graph illustrating effects of executing the modifying step depending on a time period of the modifying step.

FIG. 11 illustrates experimental results of a similar experiment of executing a modifying step for every lot. The processing conditions implemented in the present experiment were identical to the processing conditions implemented in FIG. 9 except that the processing time of the modifying step was reduced to 5 seconds.

FIG. 11 illustrates the pin torque upon wafer separation for the 25 wafers of a first lot and a second lot. It can be appreciated from FIG. 11 that the pin torque upon wafer separation tends to decrease as the lot number increases. However, in the case where the processing time of the modifying step is 5 seconds, effects of decreasing the pint torque upon wafer separation become weaker compared to the case where the processing time of the modifying step is 10 seconds.

Note that ameliorative effects on the pin torque upon wafer separation may be obtained when a modifying step is executed each time one wafer is processed. However, in such case, the throughput decreases and productivity may be unnecessarily degraded. Accordingly, a modifying step according to an embodiment of the present invention is preferably executed for every lot; namely, after processing several to several tens of wafers. In this way, the pin torque upon wafer separation may be prevented from increasing without adversely affecting productivity.

According to an aspect of the present embodiment, in the case of performing waferless dry cleaning between wafer processes using a fluorine gas, a modifying step may be executed at a suitable timing to prevent the electrostatic attractive force of the electrostatic chuck from changing over time. In this way, the pin torque upon wafer separation may be decreased so that bombardment-related damage and cracking of the wafer may be prevented, and the throughput may be prevented from decreasing. As a result, productivity may be maintained at a desirably high level.

[Modifying Step Mechanism]

Figure 12:
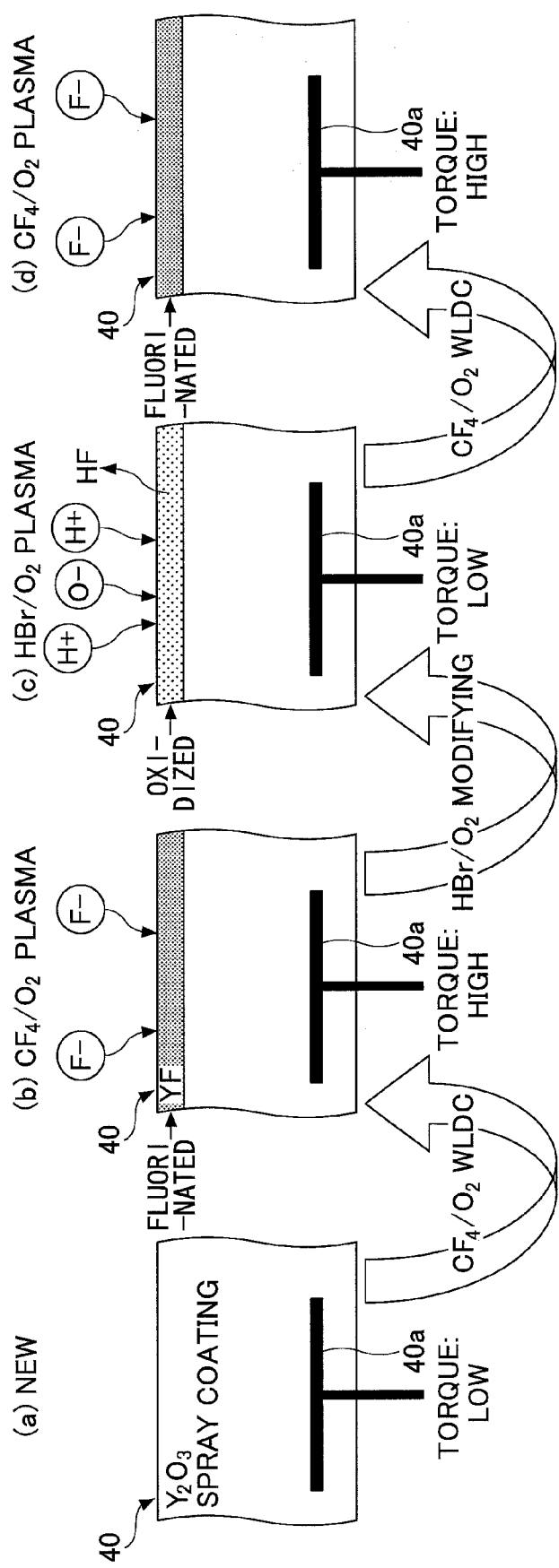
FIG. 12 illustrates a torque improving mechanism of a modifying step according to an embodiment of the present invention.

In the following, a mechanism of a modifying step according to an embodiment of the present invention is described with reference to FIG. 12. When the electrostatic chuck 40 is new as illustrated in FIG. 12(a), a yttrium oxide ($Y_2O_3$) coating that is thermally sprayed on the electrostatic chuck 40 makes up the electrostatic chuck surface. When the electrostatic chuck surface is $Y_2O_3$, the electrostatic chuck 40 generates a Coulomb force to electrostatically attract a wafer.

For example, in a wafer process for etching a silicon-based film, a silicon-based reaction by-product is deposited on the inner wall surface of the chamber 10. To remove the deposited reaction by-product, a cleaning process such as WLDC is executed for every wafer process using plasma generated from a gas including fluorine gas such as $CF_4$ gas. Because the cleaning process is performed without a wafer, the electrostatic chuck 40 is exposed to the fluorine plasma during the cleaning process. As a result, the electrostatic chuck surface is gradually fluorinated and modified from $Y_2O_3$ to YF as illustrated in FIG. 12(b). YF has a lower volume resistivity compared to $Y_2O_3$. Accordingly, when the electrostatic chuck surface is modified to YF, the electrostatic chuck also generates a Johnsen-Rahbek force to attract the wafer so that the electrostatic attraction force for attracting the wafer increases. As a result, the pin torque upon wafer separation increases thereby making it difficult to separate the wafer from the electrostatic chuck, and in some cases, the wafer may be damaged or broken as a result.

According to an aspect of the present invention, a modifying step using plasma generated from a gas mixture of HBr gas and $O_2$ gas as illustrated in FIG. 12(c) is performed between the wafer processes. In the modifying step, hydrogen components (H ions and H radicals) within the plasma react with the YF layer on the electrostatic chuck surface, and F (fluorine) is extracted from the YF layer to be turned into HF. Further, O (oxygen) components within the plasma are filled into the electrostatic chuck surface after F is extracted therefrom. By causing such a reaction in the modifying step, the F density at the electrostatic chuck surface may be reduced and the electrostatic chuck surface may be converted to a state closer to $Y_2O_3$ than YF. By oxidizing the fluorinated electrostatic chuck surface in the modifying step and converting the electrostatic chuck surface to a state close to $Y_2O_3$, the volume resistivity of the electrostatic chuck 40 may become higher. As a result, the electrostatic chuck 40 may revert back to generating a Coulomb force to electrostatically attract a wafer and the pin torque upon wafer separation may be decreased.

However, after executing the modifying, when WLDC is repeatedly executed for every wafer process as illustrated in FIG. 12(d), the electrostatic chuck surface may be fluorinated again, and as a result, the volume resistivity of the electrostatic chuck may decrease and the electrostatic chuck may also generate a Johnsen-Rahbek force to thereby increase its electrostatic attraction force. In this way, the pin torque upon wafer separation may increase once again. Accordingly, the modifying step is preferably repeated at predetermined timings between wafer processes. With the mechanism of torque improvement through execution of the modifying step as described above, the pin torque upon wafer separation may be prevented from increasing and the original wafer attracting function of the electrostatic chuck 40 based on the Coulomb force may be maintained.

(Gas Ratio Optimization)

As described above, the ratio of $O_2$ gas with respect to HBr gas of a gas mixture used in the modifying step is preferably arrange to be relatively low. In this respect, further experiments were conducted to find an optimal ratio of $O_2$ gas with respect to HBr gas. FIG. 13 illustrates the results of these experiments. FIG. 13 indicates four sample ratios identified as "HBr/$O_2$ ratio (1)," "HBr/$O_2$ ratio (2)," "HBr/$O_2$ ratio (3)," and "HBr gas alone," and their corresponding pin torques upon wafer separation after WLDC and a modifying step are executed in this sequence (WLDC→modifying step). The WLDC processing conditions and the modifying step processing conditions implemented for each sample ratio are indicated below.

<WLDC Processing Conditions>

| | |
|---|---|
| Pressure | 400 mT (53.3 Pa) |
| Power | High frequency power for plasma: 750 W |
| | High frequency power for biasing: 0 W |
| Magnetic Field | 56 G |
| Gas Type & Gas Ratio | $CF_4$ gas/$O_2$ gas |
| | $CF_4$ gas:$O_2$ gas = 1:1 |
| Processing Time | 25 seconds |

<Modifying Step Processing Conditions for HBr/$O_2$ Ratio (1)>

| | |
|---|---|
| Pressure | 300 mT (40.0 Pa) |
| Power | High frequency power for plasma: 450 W |
| | High frequency power for biasing: 0 W |
| Magnetic Field | 320 G |
| Gas Type & Gas Ratio | HBr gas/$O_2$ gas |
| | HBr gas:$O_2$ gas = 1:1 |
| Processing Time | 10 seconds |

<Modifying Step Processing Conditions for HBr/$O_2$ Ratio (2)>

Same processing conditions as the processing conditions for HBr/$O_2$ ratio (1) except the gas ratio HBr gas:$O_2$ gas=49:1

<Modifying Step Processing Conditions for HBr/$O_2$ Ratio (3)>

Same processing conditions as the processing conditions for HBr/$O_2$ ratio (1) except the gas ratio HBr gas:$O_2$ gas=99:1

<Modifying Step Processing Conditions for HBr Gas Alone>

Same processing conditions as the processing conditions for HBr/$O_2$ ratio (1) except the gas ratio HBr gas:$O_2$ gas=100:0

According to the experimental results shown in FIG. 13, a substantial decrease in the pin torque upon wafer separation could not be observed in a wafer process performed after the modifying step in a case where the HBr gas-to $O_2$ gas flow rate ratio was equal to 1 (HBr/$O_2$ ratio (1)).

On the other hand, in the case where the HBr gas-to $O_2$ gas flow rate ratio was equal to 1/49 (HBr/$O_2$ ratio (2)), the pin torque upon wafer separation after executing the modifying step was decreased to 5.5%. Also, in the case where the HBr gas-to $O_2$ gas flow rate ratio was equal to 1/99 (HBr/$O_2$ ratio (3)), the pin torque upon wafer separation after executing the modifying step was decreased to 4.3%.

However, in the case where HBr gas alone was used in the modifying step, a substantial decrease in the pin torque upon wafer separation could not be observed in a wafer process performed after the modifying step.

In the following, a likely reason for the decreasing effect of the pin torque upon wafer separation improving in terms of immediacy and sustainability as a result of lowering the ratio of $O_2$ gas with respect to HBr gas in the modifying step is explained. When the ratio of $O_2$ gas with respect to HBr gas is increased, reaction between H components and O components within plasma to generate $H_2O$ is prioritized. As a result, H ions and H radicals are consumed by the above reaction. This in turn deters a reaction between the H ions and H radicals within the plasma and the YF layer on the electrostatic chuck surface. As a result, F may not be extracted from the YF layer on the electrostatic chuck surface, and the F density on the electrostatic chuck surface may not be reduced. Thus, volume resistivity of the electrostatic chuck surface may not be increased and the pin torque upon wafer separation may not be decreased.

On the other hand, when the ratio of $O_2$ gas with respect to HBr gas is decreased, the H ions and H radicals within the plasma react with the YF layer on the electrostatic chuck surface, and F may be extracted from the YF layer on the electrostatic chuck surface. In turn, O components may be filled into the electrostatic chuck surface after F is extracted, and the electrostatic chuck surface may be in a state similar to that of $Y_2O_3$. In this way, the volume resistivity of the electrostatic chuck surface may be increased and the pin torque upon wafer separation may be decreased.

In the case where HBr gas is used alone and $O_2$ gas is not used in the modifying step, the effects of decreasing the pin torque upon wafer separation cannot be obtained. This is because even when the H ions and H radicals within the plasma react with the YF layer on the electrostatic surface and F is extracted from the YF layer, there are no O components within the plasma that can be filled into the electrostatic chuck surface. Accordingly, the electrostatic chuck surface cannot be converted to a state close to that of $Y_2O_3$, the volume resistivity of the electrostatic chuck surface cannot be increased, and the pin torque upon wafer separation cannot be decreased. Thus, in a modifying step according to an embodiment of the present invention, a gas mixture including HBr gas and $O_2$ gas is used.

Also, as described above, when the ratio of $O_2$ gas with respect to HBr gas is increased, ameliorative effects on the pin torque upon wafer separation tend to become weaker. Based on the above experimental results, it can be appreciated that favorable effects of decreasing the pin torque upon wafer separation may be obtained in terms of immediacy and sustainability when the flow rate ratio of $O_2$ gas with respect to HBr gas is adjusted to a ranged between "HBr/$O_2$ ratio (2)" and "HBr/$O_2$ ratio (3)," namely, from 1/99 to 1/49. Further, the flow rate ratio of $O_2$ gas with respect to HBr gas is preferably adjusted to be close to or equal to the lower limit of the above range.

Although the method of modifying the electrostatic chuck and the plasma processing apparatus of the present invention are described above with reference to certain illustrative embodiments, the present invention not limited to these embodiments but includes numerous variations and modifications that may be made without departing from the scope of the present invention.

For example, although a gas mixture of a H-containing gas and an O-containing gas is used in the modifying steps of the above-described embodiments, the present invention is not limited to the gas mixture used in the above embodiments. That is, a method of modifying an electrostatic chuck and a plasma processing apparatus according to the present invention may use a gas mixture including another type of gas so long as a H-containing gas and an O-containing gas are also included in the gas mixture.

Also, the gas mixture used in the modifying step does not necessarily have to be a gas mixture including a H-containing gas and an O-containing gas, but may alternatively be a gas mixture including a CHF-containing gas and a O-containing gas, for example. Specific examples of a CHF-containing gas include but are not limited to $CH_2F_2$ gas and $CHF_3$ gas.

Also, the present invention may use various means for generating plasma including, but not limited to, capacitively coupled plasma (CCP) generation systems, inductively coupled plasma (ICP) generation systems, helicon wave plasma (HWP) generation systems, surface wave plasma generation systems including radial line slot antenna (RLSA) microwave plasma generation systems and slot plane antenna (SPA) plasma systems, electron cyclotron resonance plasma generation systems, and remote plasma generation systems using the above plasma generation systems, for example.

Also, a processing object that is processed in the present invention is not limited to the (semiconductor) wafer W, but may alternatively be some other type of substrate including, but no limited to, a large substrate for a flat panel display and a substrate for an EL (electroluminescence) element or a solar power battery, for example.

What is claimed is:

1. A method of modifying an electrostatic chuck that electrostatically attracts a processing object, the method comprising:
a gas supplying step of supplying a gas containing hydrogen (H) and oxygen (O) into a chamber accommodating the electrostatic chuck having a surface that is fluorinated; and
a modifying step of turning the gas supplied to the chamber into plasma using a radio frequency power, exposing the electrostatic chuck to the plasma, and modifying the fluorinated surface of the electrostatic chuck.

2. The method as claimed in claim 1, further comprising:
a cleaning step of executing waferless dry cleaning of the chamber using a cleaning gas containing a fluorine-based gas, the cleaning step being executed before or after the modifying step.

3. The method as claimed in claim 1, wherein the gas supplied to the chamber in the gas supplying step includes hydrogen bromide (HBr) gas and oxygen ($O_2$) gas.

4. The method as claimed in claim 3, wherein a flow rate ratio of the oxygen gas with respect to the hydrogen bromide gas of the gas supplied to the chamber in the gas supplying step is equal to a value within a range from 1/99 to 1/49.

5. The method as claimed in claim 2, wherein a magnetic flux density of a magnetic field generated during the modifying step by a magnetic field generating mechanism arranged near the chamber is adjusted to be higher than a magnetic flux density of a magnetic field generated by the magnetic field generating mechanism during the cleaning step.

6. The method as claimed in claim 1, wherein the electrostatic chuck includes yttrium oxide ($Y_2O_3$) that is fluorinated at the surface of the electrostatic chuck.

7. The method as claimed in claim 1, wherein the hydrogen (H) supplied to the chamber in the gas supplying step bonds with fluorine (F) on the surface of the electrostatic chuck, and the oxygen (O) supplied to the chamber in the gas supplying step oxidizes the surface of the electrostatic chuck.

8. The method as claimed in claim 1, wherein the modifying step is executed with respect to every lot.

* * * * *